(12) United States Patent
Basker et al.

(10) Patent No.: US 9,660,035 B2
(45) Date of Patent: May 23, 2017

(54) SEMICONDUCTOR DEVICE INCLUDING SUPERLATTICE SIGE/SI FIN STRUCTURE

(71) Applicant: International Business Machines Corporation, Armonk, NY (US)

(72) Inventors: Veeraraghavan S. Basker, Schenectady, NY (US); Tenko Yamashita, Schenectady, NY (US); Chun-chen Yeh, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 4 days.

(21) Appl. No.: 14/167,110

(22) Filed: Jan. 29, 2014

(65) Prior Publication Data

US 2015/0214351 A1    Jul. 30, 2015

(51) Int. Cl.
*H01L 29/15* (2006.01)
*H01L 29/78* (2006.01)
*H01L 29/66* (2006.01)
*H01L 29/165* (2006.01)
*H01L 21/225* (2006.01)
*H01L 29/49* (2006.01)
*H01L 29/51* (2006.01)
(Continued)

(52) U.S. Cl.
CPC ........ *H01L 29/158* (2013.01); *H01L 21/2251* (2013.01); *H01L 29/1054* (2013.01); *H01L 29/165* (2013.01); *H01L 29/495* (2013.01); *H01L 29/4966* (2013.01); *H01L 29/4983* (2013.01); *H01L 29/517* (2013.01); *H01L 29/66545* (2013.01); *H01L 29/66795* (2013.01); *H01L 29/785* (2013.01); *H01L 21/02532* (2013.01); *H01L 21/02667* (2013.01)

(58) Field of Classification Search
CPC ..................... H01L 29/66795; H01L 29/158
See application file for complete search history.

(56) References Cited

U.S. PATENT DOCUMENTS

| 6,838,322 B2 | 1/2005 | Pham et al. |
| 7,198,995 B2 | 4/2007 | Chidambarrao et al. |
| (Continued) | | |

OTHER PUBLICATIONS

Bean et al., "Ge x Si 1-x/Si strained-layer superlatt ice grown by molecular beam epitaxy," Journal of Vacuum Science & Technology A, vol. 2, No. 2, 1984, pp. 436-440.
(Continued)

*Primary Examiner* — Robert Huber
*Assistant Examiner* — Xia Cross
(74) *Attorney, Agent, or Firm* — Cantor Colburn LLP; Vazken Alexanian

(57) ABSTRACT

A semiconductor device includes a semiconductor-on-insulator substrate having an insulator layer, and at least one silicon germanium (SiGe) fin having a superlattice structure. The SiGe fin is formed on an upper surface of the insulator layer. A gate stack is formed on an upper surface of the at least one silicon germanium fin. The gate stack includes first and second opposing spacers defining a gate length therebetween. First and second epitaxial source/drain structures are formed on the insulator layer. The first and second epitaxial source/drain structures extend beneath the spacer to define a silicon germanium gate channel beneath the gate stack.

11 Claims, 20 Drawing Sheets

(51) Int. Cl.
*H01L 29/10* (2006.01)
*H01L 21/02* (2006.01)

(56) References Cited

U.S. PATENT DOCUMENTS

| | | |
|---|---|---|
| 7,202,494 B2 | 4/2007 | Blanchard et al. |
| 7,314,802 B2 | 1/2008 | Zhu et al. |
| 7,323,710 B2 | 1/2008 | Kim et al. |
| 7,326,652 B2 | 2/2008 | Chau et al. |
| 7,326,656 B2* | 2/2008 | Brask et al. ............. 438/785 |
| 7,411,214 B2 | 8/2008 | Chu |
| 7,872,303 B2 | 1/2011 | Chan et al. |
| 2004/0219722 A1* | 11/2004 | Pham ............... H01L 29/785 438/157 |
| 2005/0272192 A1* | 12/2005 | Oh et al. ................... 438/197 |
| 2007/0196973 A1* | 8/2007 | Park ............ H01L 21/823412 438/197 |
| 2008/0242037 A1 | 10/2008 | Sell et al. |
| 2011/0156107 A1* | 6/2011 | Bohr et al. ............... 257/288 |
| 2012/0032231 A1 | 2/2012 | Wang et al. |
| 2013/0154016 A1 | 6/2013 | Glass et al. |
| 2013/0175579 A1* | 7/2013 | Cheng ............ H01L 29/66795 257/192 |
| 2013/0248999 A1* | 9/2013 | Glass et al. ............... 257/335 |
| 2013/0270638 A1* | 10/2013 | Adam ............ H01L 29/66795 257/347 |
| 2014/0065782 A1* | 3/2014 | Lu et al. ................... 438/294 |

OTHER PUBLICATIONS

Bernard et al., "Strain energy and stability of Si—Ge compounds, alloys, and superlattices," Physical Review B, vol. 44, No. 4, 1991, pp. 1663-1681.

Hartmann et al., "Growth and Thermal Stability of SiGe/Si Superlattices on Bulk Si Wafers," ECS Transactions, vol. 16, No. 10, 2008, pp. 341-351.

Shin et al., "A narrow bandgap SiGe channel superlattice bandgap engineered 1T DRAM cell for low voltage operation and extended hole retention time", Semiconductor Science and Technology, 26, 095025, 2011.

* cited by examiner

SEMICONDUCTOR DEVICE INCLUDING SUPERLATTICE SIGE/SI FIN STRUCTURE

BACKGROUND

The present invention relates to finFET semiconductor devices, and more specifically, to a finFET including a superlattice silicon germanium/silicon (SiGe/Si) fin structure.

Conventional finFET semiconductor devices include a gate that fully wraps one or more semiconductor fins formed from Si. The wrapped gate can improve carrier depletion in the channel defined by the Si fin. Accordingly, electrostatic control of the channel defined by the Si fin may be improved.

Recent semiconductor fabrication methods have been developed to replace pure Si fins with SiGe fins. Forming the fins from SiGe reduces the threshold voltage (Vt) of the semiconductor device, thereby increasing the drive current that flows through the channel. Further, SiGe material provides higher carrier mobility than Si. Accordingly, SiGe fins may have improve electron hole mobility performance with respect to Si fins Conventional methods use an ion implantation process that drives SiGe ions into the fin to form a SiGe fin. However, these conventional methods may damage the fin and reduce overall performance of the finFET device.

SUMMARY

According to at least one exemplary embodiment, a method of fabricating a semiconductor device includes forming a semiconductor fin on an insulator layer of a semiconductor-on-insulator (SOI) substrate and forming a gate stack on the semiconductor fin. The method further includes etching the SOI substrate to expose an insulator layer to define at least one source/drain region and to expose sidewalls of the semiconductor fin. The method further includes growing a silicon germanium (SiGe) layer on the etched sidewalls of the fin. The method further includes annealing the semiconductor device to diffuse SiGe ions of the SiGe layer into the fin such that a SiGe fin having a superlattice structure is formed beneath the gate stack.

According to another exemplary embodiment, a semiconductor device comprises a semiconductor-on-insulator substrate including an insulator layer, and at least one fin having a superlattice silicon germanium/silicon structure. The fin is formed on an upper surface of the insulator layer. A gate stack is formed on an upper surface of the at least one fin. The gate stack includes first and second opposing spacers defining a gate length therebetween. First and second epitaxial source/drain structures are formed on the insulator layer. The first and second epitaxial source/drain structures extend beneath the spacer to define a superlattice silicon germanium/silicon gate channel beneath the gate stack.

Additional features are realized through the techniques of the present invention. Other embodiments are described in detail herein and are considered a part of the claimed invention. For a better understanding of the invention and related features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features of the invention are apparent from the following detailed description taken in conjunction with the accompanying drawings. FIGS. 1-19 illustrate a process flow of fabricating a semiconductor device according to at least one exemplary embodiment in which:

FIG. 1 illustrates a semiconductor-on-insulator (SOI) substrate including a semiconductor fin formed on a buried insulation layer and a gate stack formed on the fin;

FIG. 2 illustrates the SOI substrate of FIG. 1 following deposition of a hardmask block layer that covers the fin and the gate stack;

FIG. 3 illustrates the SOI substrate of FIG. 2 after etching the hardmask block layer to form a spacer that covers the gate stack;

FIG. 4 illustrates the SOI substrate of FIG. 3 after etching the source/drain regions of the fin to expose the underlying buried insulator layer and sidewalls of the fin;

FIG. 5 illustrates the SOI substrate of FIG. 4 following epitaxial growth of a silicon germanium layer at the etched sidewalls of the fin;

FIG. 6 illustrates the SOI substrate of FIG. 5 undergoing an annealing process that induces diffusion of silicon germanium ions into the fin;

FIG. 7 illustrates the SOI substrate of FIG. 6 showing a superlattice silicon germanium/silicon fin extending beneath the gate stack following the diffusion of silicon germanium ions into the fin;

FIG. 8 illustrates the SOI substrate of FIG. 7 following epitaxially grown source/drain regions;

FIG. 9 illustrates the SOI substrate of FIG. 8 following deposition of a nitride block layer on exposed surfaces of the epitaxially grown source/drain regions and spacer;

FIG. 10 illustrates the SOI substrate of FIG. 9 after etching the nitride block layer to form spacer extensions on a portion of the spacer;

FIG. 11 illustrates the SOI substrate of FIG. 10 undergoing a second annealing process to diffuse doped ions of the epitaxially grown source/drain regions into the fin;

FIG. 12 illustrates the SOI substrate of FIG. 11 following deposition of dielectric layer on upper surfaces of the epitaxially grown source/drain regions, the spacer extensions, and the exposed portion of the spacer;

FIG. 13 illustrates the SOI substrate of FIG. 12 after etching the dielectric layer and spacer to expose a dummy gate of the gate stack;

FIG. 14 illustrates the SOI substrate of FIG. 13 following removal of the dummy gate to form a trench in the gate stack;

FIG. 15 illustrates the SOI substrate of FIG. 14 following deposition of a dielectric block layer on an upper surface of the etched dielectric layer and in the trench;

FIG. 16 illustrates the SOI substrate of FIG. 15 following patterning of the dielectric block layer to form a gate insulation layer in the trench;

FIG. 17 illustrates the SOI substrate of FIG. 16 following deposition of a metal contact layer on an upper surface of the gate insulation layer;

FIG. 18 illustrates the SOI substrate of FIG. 17 following deposition of a metal block layer on an upper surface of the metal contact layer and in the trench; and FIG. 19 illustrates the SOI substrate of FIG. 18 after etching portions of the metal block layer, metal contact layer, gate insulation layer and dielectric layer to expose the epitaxially grown source/drain regions and to form a metal gate above a superlattice silicon germanium/silicon gate channel.

DETAILED DESCRIPTION

Figure 1:
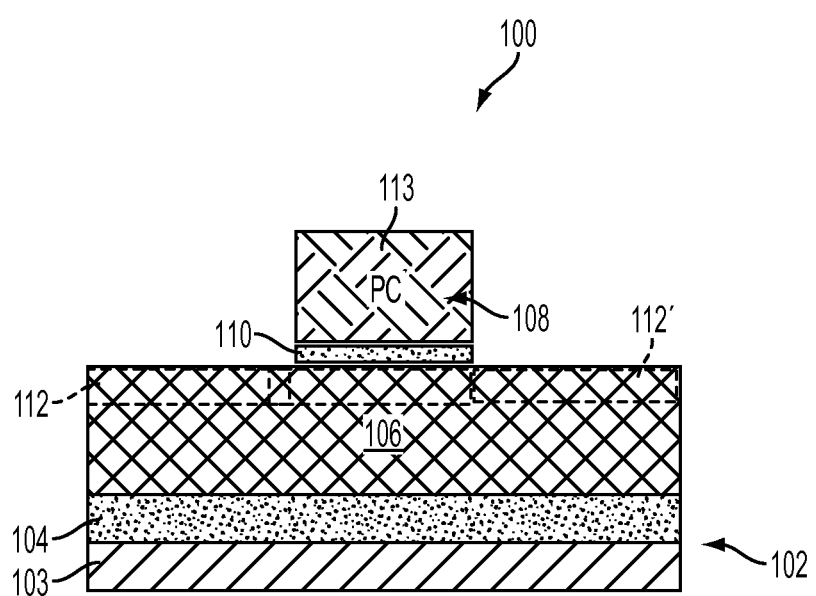

With reference now to FIG. 1, a semiconductor device 100 is illustrated according to an exemplary embodiment. The semiconductor device 100 includes a semiconductor-on-insulator (SOI) substrate 102. The SOI substrate 102 may include a bulk substrate layer 103 and a buried insulator layer 104. The bulk substrate layer 103 may be formed from a semiconductor material such as silicon (Si), for example. The buried insulator layer 104 may be formed from, for example, an oxide material to form a buried oxide (BOX) layer as understood by those ordinarily skilled in the art. One or more semiconductor fins 106 are formed on the buried insulator layer 104. The semiconductor fins 106 may be formed by etching an active semiconductor block layer (not shown) formed on the buried insulator layer 104 using a sidewall image transfer (SIT) process as understood by those ordinarily skilled in the art. According to at least one embodiment, an active silicon (Si) layer (not shown) may be formed on the buried insulator layer 104 to form a semiconductor fin 106 made from Si.

A dummy gate stack 108 is formed to wrap around the upper surface and sides of the semiconductor fins 106. Accordingly, a portion of the fin formed beneath the dummy gate stack 108 defines a gate channel interposed between exposed portions of the semiconductor fin 106. The exposed portions of the semiconductor fin 106 define a first source/drain (S/D) region 112 and a second source/drain (S/D) region 112'. The dummy gate stack 108 further includes a gate insulator 110 interposed between a dummy gate 113 and the semiconductor fin 106. The gate insulator 110 may be formed from silicon oxide ($SiO_2$), for example. The dummy gate 113 may be formed from a polysilicon material, which may be replaced according to a replacement metal gate (RMG) process as understood by those ordinarily skilled in the art.

Figure 2:
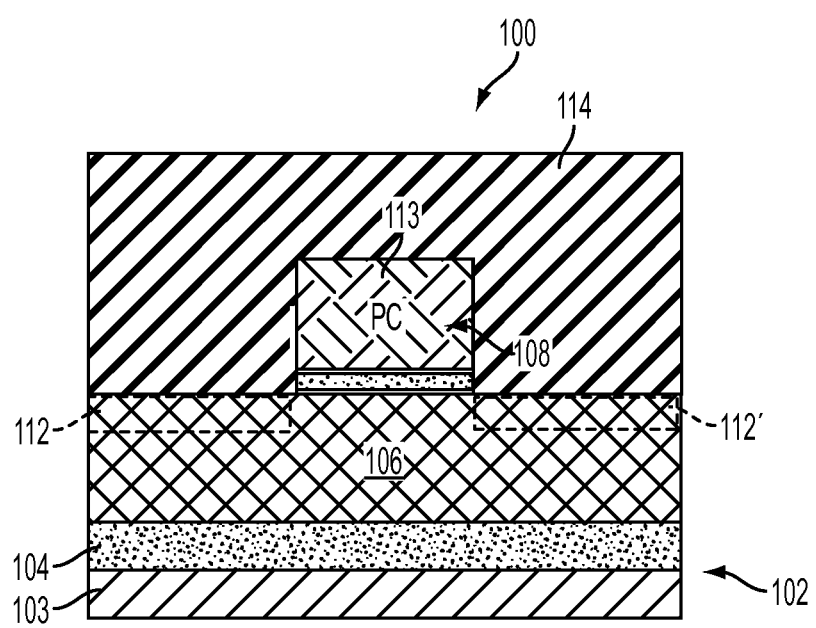

Turning to FIG. 2, a hardmask block layer 114 is deposited on the semiconductor device 100. The hardmask block layer 114 covers the semiconductor fin 106 and the dummy gate stack 108. The hardmask block layer 114 may be formed from various masking materials including, but not limited to, silicon nitride ($Si_3N_4$). The hardmask block layer 114 may be deposited using, for example, chemical vapor deposition (CVD).

Figure 3:
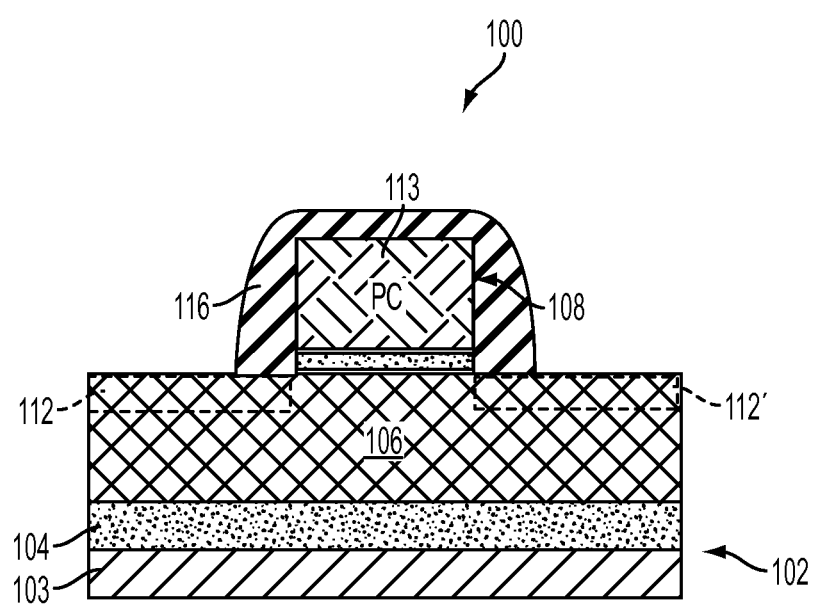

Referring to FIG. 3, the hardmask block layer 114 is etched to form a spacer 116 that covers the dummy gate stack 108 and a portion of the semiconductor fin 106. The hardmask block layer 114 may be etched using, for example, a reactive ion etching (RIE) technique. The thickness of the spacer 116 sidewalls defines an effective offset distance between the exposed surface of the first and second S/D regions 112/112', and the dummy gate stack 108.

Figure 4:
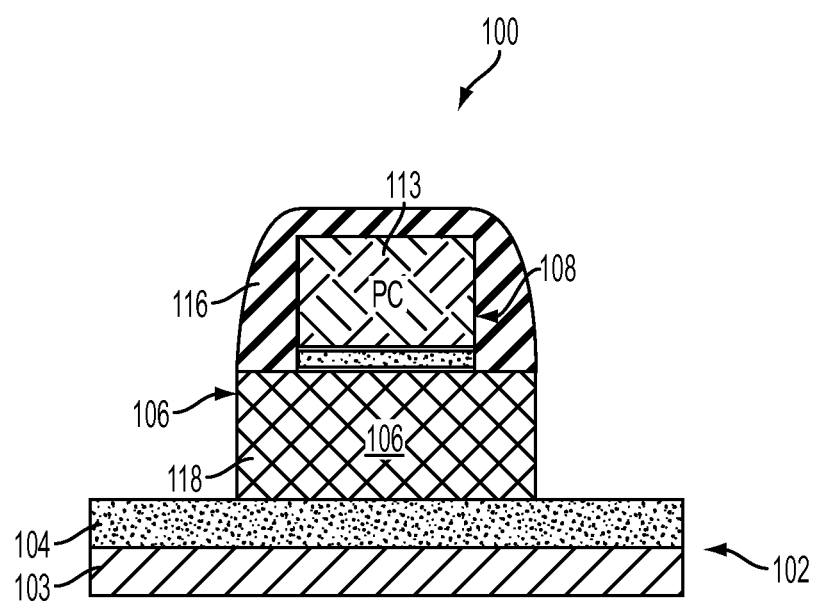

Turning now to FIG. 4, the first S/D region 112 and second S/D region 112' are etched below the spacer 116 to expose the underlying buried insulator layer 104 and Si sidewalls 118 of the semiconductor fin 106. Various etching techniques may be used to etch the first S/D region 112 and second S/D region 112' including, but not limited to, an SIT process.

Figure 5:
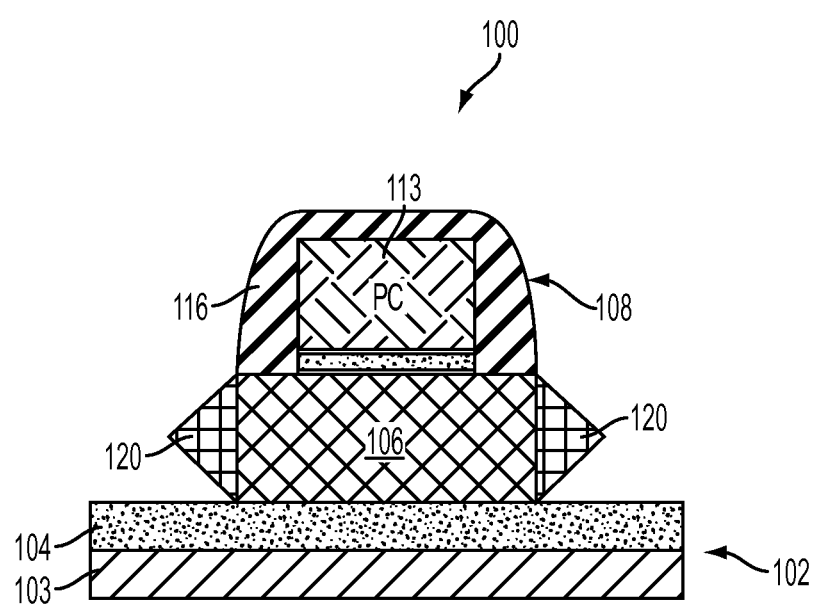

Referring now to FIG. 5 a SiGe layer 120 is epitaxially grown at the etched fin sidewalls 118 of the semiconductor fin 106. The exposed Si material of the semiconductor fin 106 provides an epitaxial template. Accordingly, the SiGe layer 120 may be grown by introducing a gas containing SiGe ions to the exposed Si fin sidewalls 118 of the semiconductor fin 106. The SiGe ions attached to the exposed Si, and are epitaxially grown from the fin sidewalls 118 of the semiconductor fin 106 as understood by those ordinarily skilled in the art. Although the SiGe layer 120 is shown as having a faceted triangular shape extending outwardly from the sidewalls 118, the shape of the SiGe layer 120 is not limited thereto.

Figure 6:
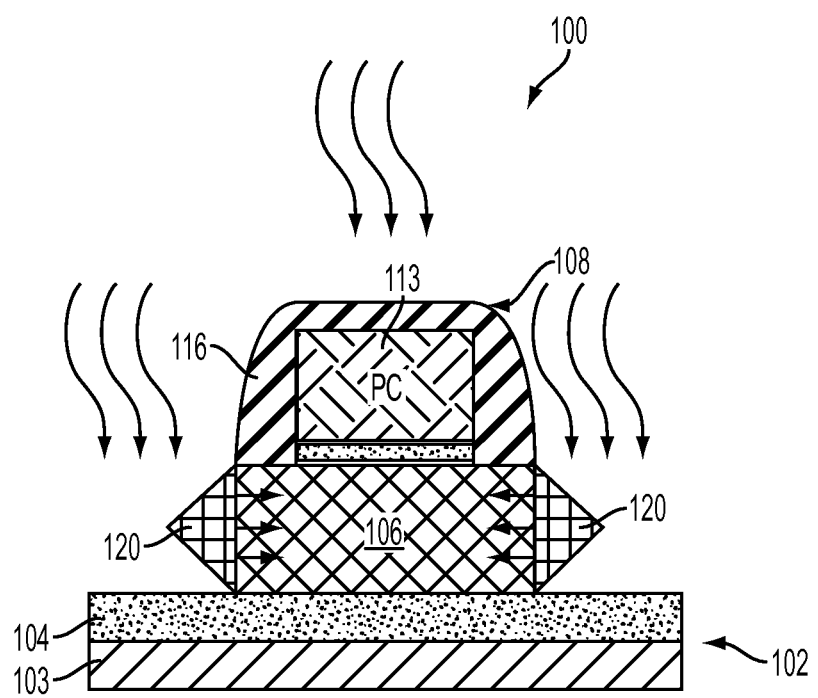
Figure 7:
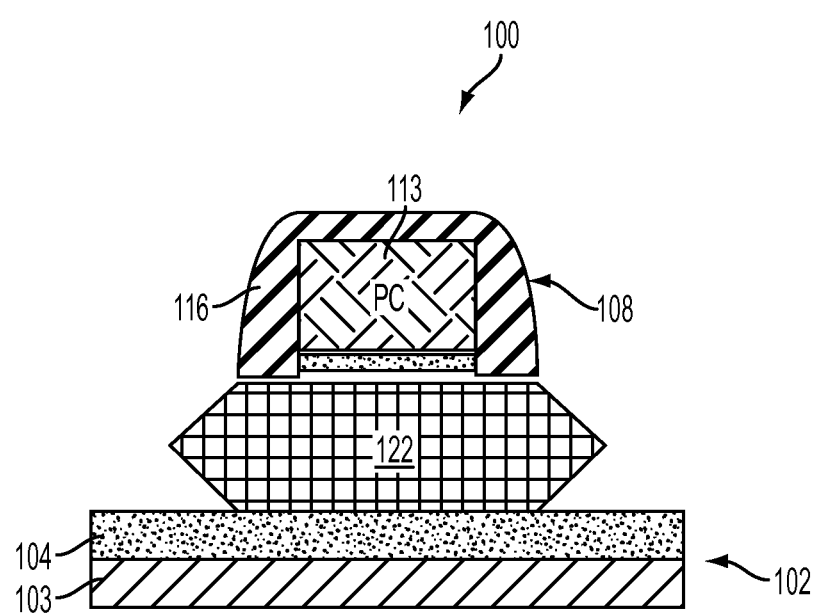

With reference now to FIGS. 6-7, an annealing operation is applied to the semiconductor device 100 to heat the SiGe layer 120. A temperature applied during the annealing operation may range, for example, from approximately 1025 degrees Celsius (° C.) to approximately 1050° C. In response to the heat, the SiGe ions of the SiGe layer 120 diffuse into the Si semiconductor fin 106 and beneath the dummy gate stack 108. Accordingly, a superlattice SiGe/Si fin 122 is formed as illustrated in FIG. 7. The SiGe/Si fin 122 may provide a reduced threshold voltage (Vt) and may improve electron hole mobility therethrough.

Figure 8:
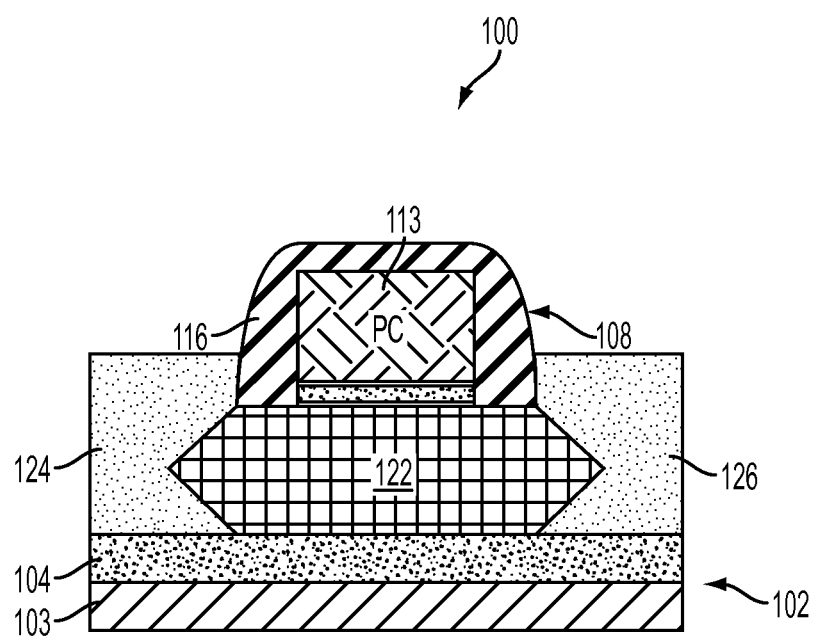

Turning now to FIG. 8, a first epitaxially grown (epi) structure 124 and second epi structure 126 are formed following an epitaxial growth process as understood by those skilled in the art. The first epi structure 124 and second epi structure 126 form elevated S/D regions of the semiconductor device 100. The first epi structure 124 and second epi structure 126 may be doped with p-type ions to form a PFET, for example. The p-type ions may include, but are not limited to, boron. In at least one exemplary embodiment, the first epi structure 124 and second epi structure 126 are doped in-situ during the epitaxially growth process. Accordingly, a p-type finFET semiconductor device may be formed, for example.

Figure 9:
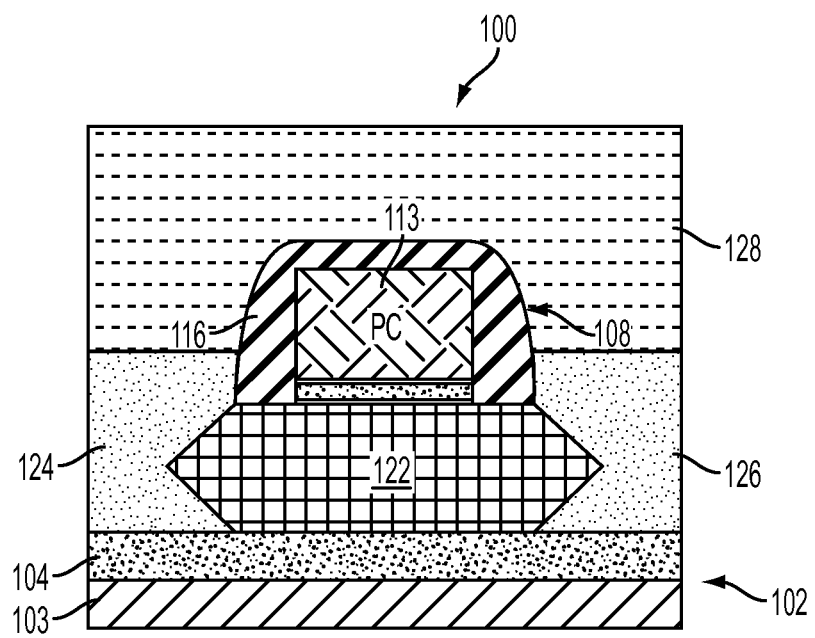

Turning to FIG. 9, a second hardmask block layer 128 is deposited on exposed surfaces of the first epi structure 124 and second epi structure 126 (i.e., the elevated S/D regions) and the spacer 116. The second hardmask block layer 128 may be formed from various materials including, but not limited to, $Si_3N_4$. The second hardmask block layer 128 may be deposited using, for example, chemical vapor deposition (CVD).

Figure 10:
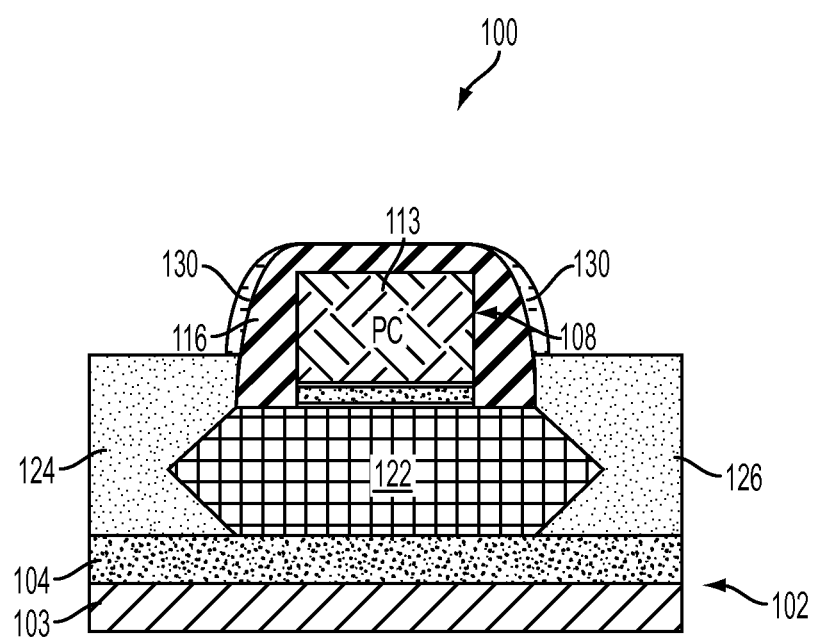

Referring now to FIG. 10, the second hardmask block layer 128 is etched to form spacer extensions 130 on sidewalls of the spacer 116. The spacer extensions 130 are configured to further protect dummy gate stack 108 during subsequent fabrication processes applied to the semiconductor device 100.

Figure 11:
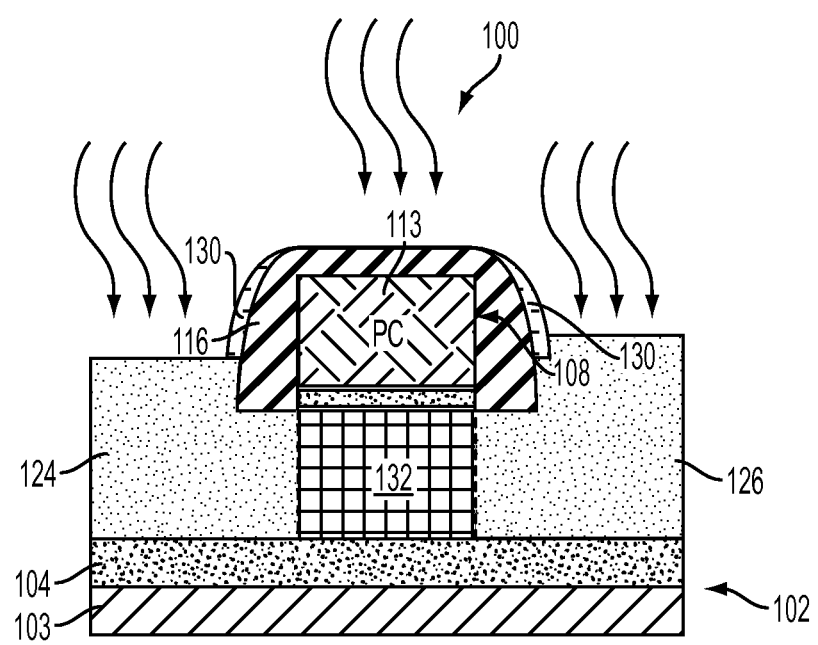

Turning to FIG. 11, a second annealing operation is applied to the semiconductor device 100. The second annealing operation causes the doped ions of the first epi structure 124 and second epi structure 126 to diffuse into SiGe/Si fin 122. The diffusion of the doped ions is controlled such that the first epi structure 124 and second epi structure 126 extend beneath the spacer 116, while maintaining a superlattice gate channel 132 beneath the dummy gate stack 108. According to at least one exemplary embodiment, since a superlattice SiGe/Si fin 122 is formed, the gate channel 132 is a superlattice SiGe/Si gate channel 132.

Figure 12:
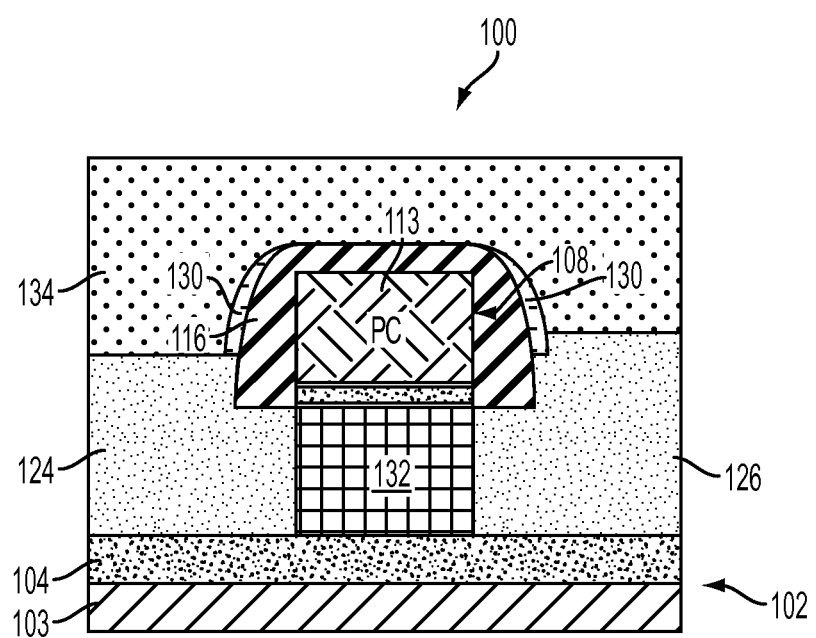

Turning now to FIG. 12, a dielectric layer 134 is deposited on upper surfaces of the first epi structure 124, the second epi structure 126, the spacer extensions 130, and the exposed portion of the spacer 116. The dielectric layer 134 may be formed from flowable low dielectric material. The low dielectric material may include, but is not limited to, silicon oxide ($SiO_2$), $SiO_2$ doped with carbon (C), and $SiO_2$ doped with hydrogen (H).

Figure 13:
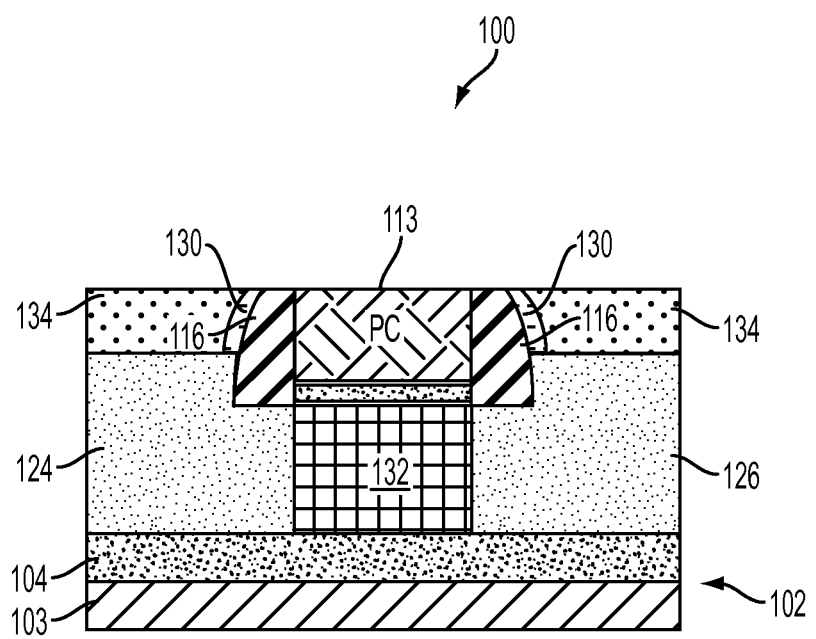

Referring to FIG. 13, the dielectric layer 134 and spacer are recessed to expose the dummy gate 113 of the dummy gate stack 108. According to at least one exemplary embodiment, a chemical-mechanical planarization (CMP) process may be used to recess the dielectric layer 134 and spacer 116.

Figure 14:
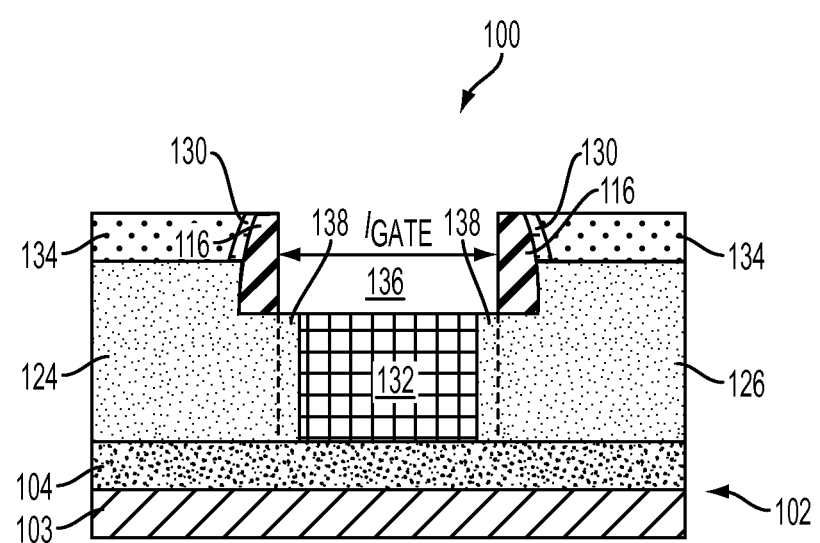

With reference now to FIGS. 14-19, an RMG process is described to form a metal gate stack having a metal gate formed over a SiGe gate channel 132. Referring to FIG. 14, the dummy gate stack 108 (including the dummy gate 113) is removed to form a trench 136 The dummy gate stack 108 may be removed according to various known RMG processes understood by those ordinarily skilled in the art. The spacer 116 may further be etched using a STI process, for example, to increase the length ($l_{GATE}$) of the trench 136 (i.e., the distance between the opposing sidewalls of the spacer 116) as further illustrated in FIG. 14. Accordingly, an S/D overlap region 138 may be formed that is offset with respect to the sidewalls of the spacer 116 and that overlaps (i.e., extend) beneath the trench 136.

Figure 15:
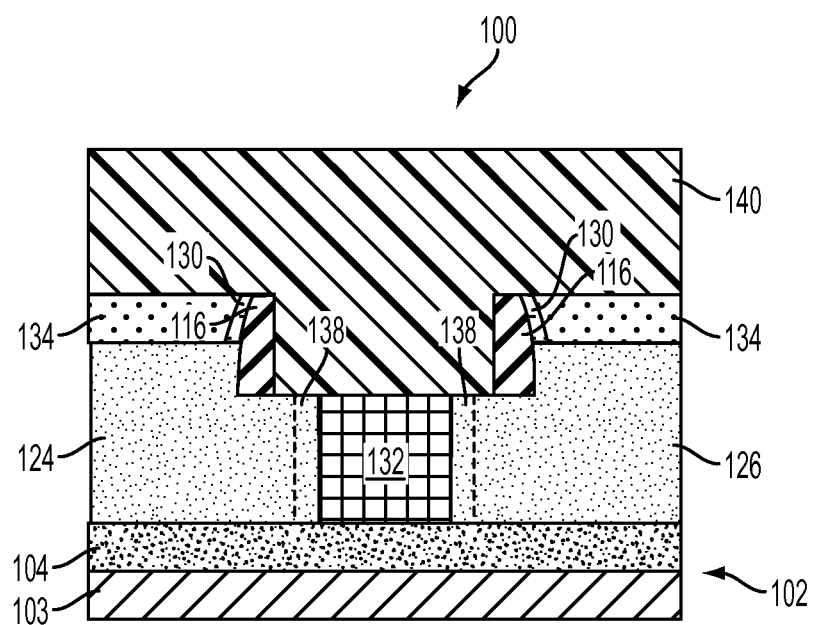

Referring now to FIG. 15, a second dielectric block layer 140 is deposited on an upper surface of the dielectric layer 134, the spacer extensions 130, the spacer 116, and in the trench 136. The second dielectric block layer 140 may be a high-k material including, but not limited to, hafnium oxide ($HfO_2$). The second dielectric block layer 140 may be deposited according to various process including, for example, CVD.

Figure 16:
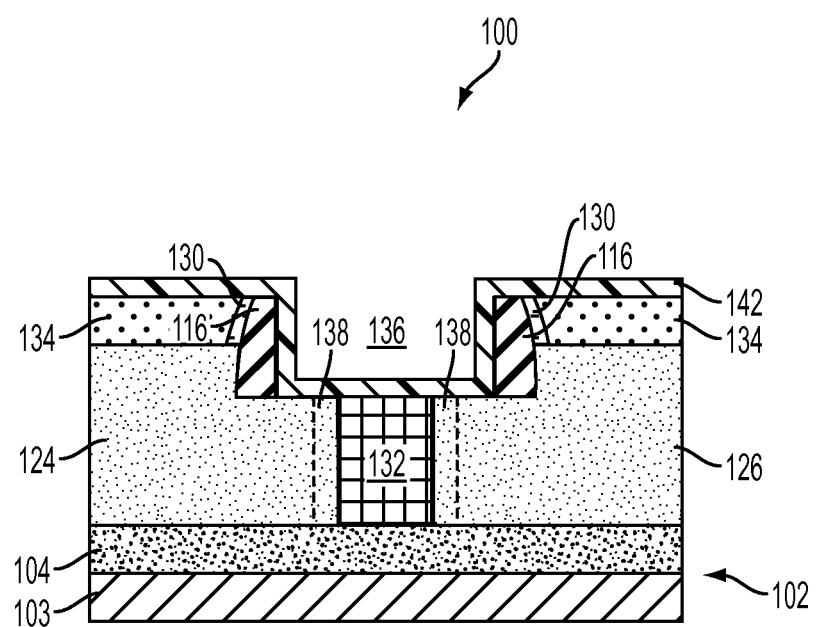

Turning to FIG. 16, the second dielectric block layer 140 is patterned to form a high-k gate insulation layer 142 formed over the sidewalls and bottom surfaces of the trench 136. Various etching process may be used to etch the second dielectric block layer 140 including, but not limited to, a reactive ion etching (RIE) process.

Figure 17:
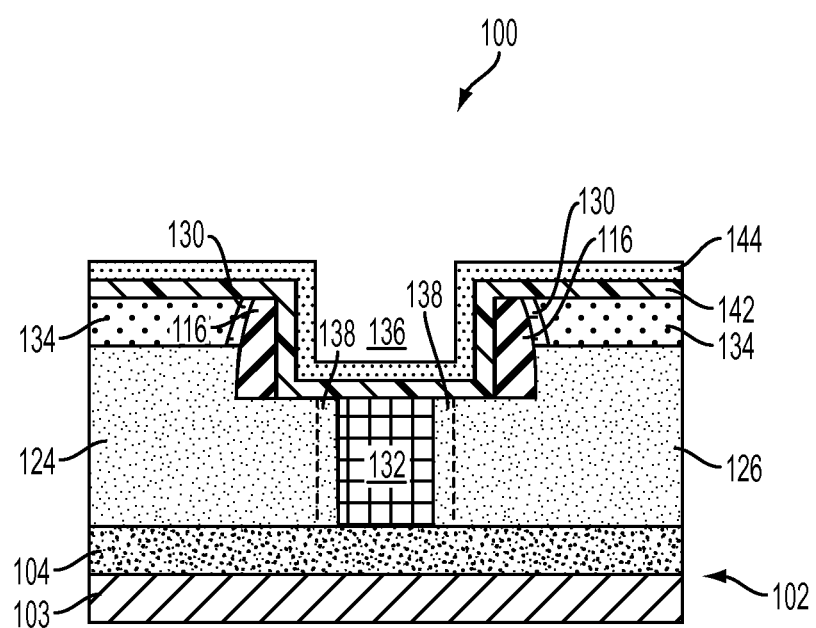

Turning now to FIG. 17, a metal contact layer 144 is formed on an upper surface of the gate insulation layer 142. The metal contact layer 114 may be formed from, for example, titanium nitride (TiN), or titanium carbide (TiC). Accordingly, the gate insulation layer 142 is interposed between a metal contact layer 144, the S/D extension portions 138, and the SiGe gate channel 132.

Figure 18:
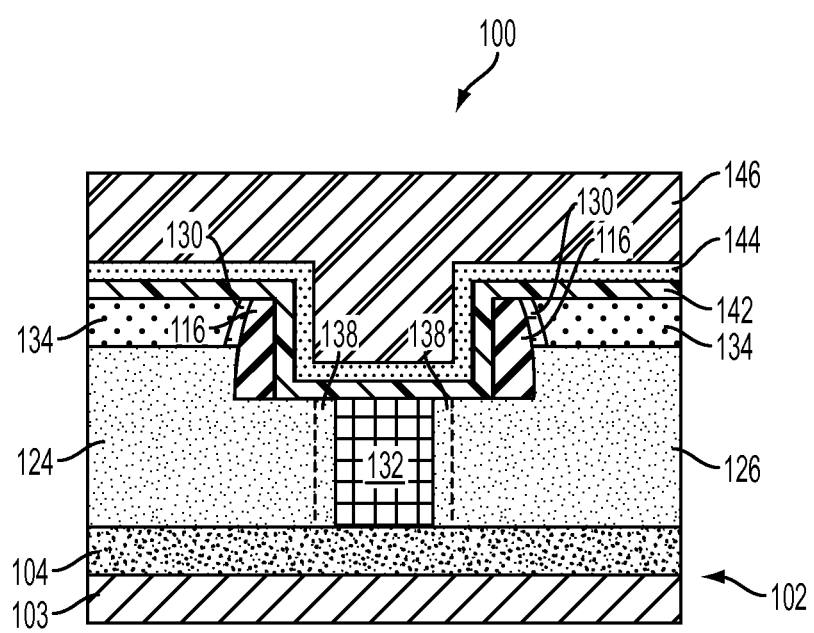

Referring to FIG. 18, a metal block layer 146 is deposited on an upper surface of the metal contact layer 144 and in the trench 136. The metal block layer 146 may be formed from various metal gate materials as understood by those ordinarily skilled in the art. In at least one exemplary embodiment, the metal gate is formed from tungsten (W).

Figure 19:
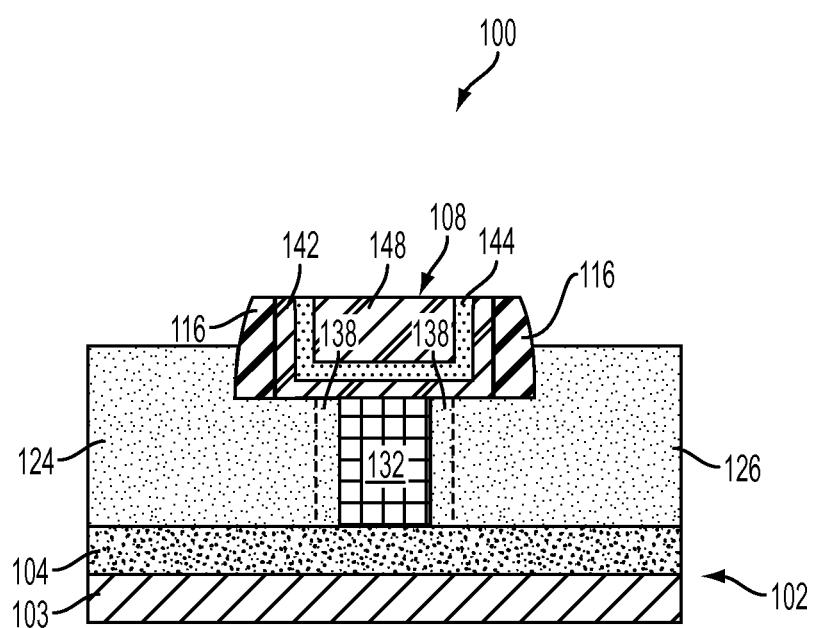

Turning now to FIG. 19, portions of the metal block layer 146, metal contact layer 144, gate insulation layer 142, and dielectric layer 134 are recessed using, for example, a CMP process to expose the epitaxially grown source/drain regions. The remaining portions of the metal block layer 146, metal contact layer 144, gate insulation layer 142, and dielectric layer 134 are planarized to form a metal gate 148.

The process flow described above provides a semiconductor device including a superlattice SiGe/Si semiconductor fin that forms a SiGe gate channel beneath the gate stack. The semiconductor device further includes one or more S/D extension portions that overlap the gate stack, while providing a SiGe gate channel. Therefore, a semiconductor device having a reduced threshold voltage (Vt) and improved electron hole mobility performance may be provided.

Figure 20:
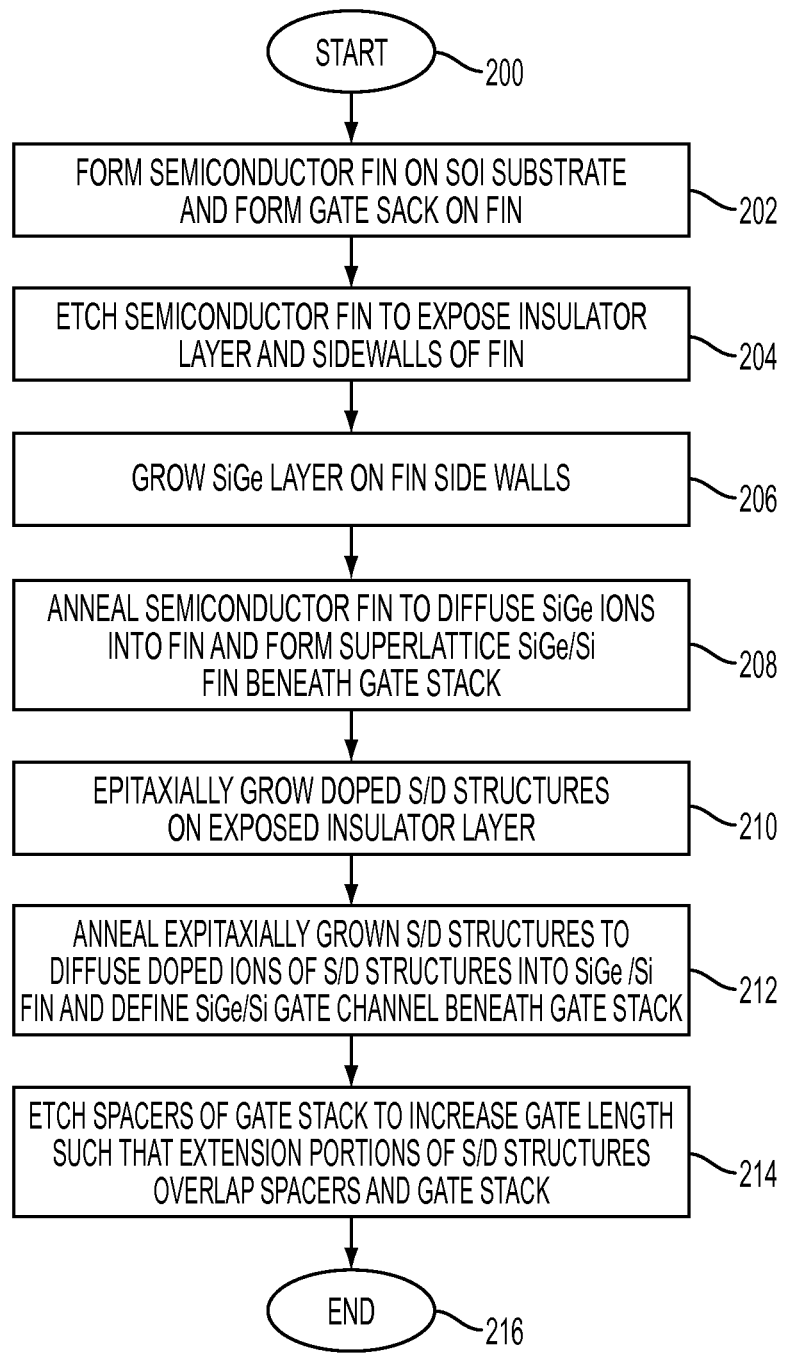
FIG. 20 is a flow diagram illustrating a method of fabricating a semiconductor device according to an exemplary embodiment.

Referring now to FIG. 20, a flow diagram illustrates a method of fabricating a semiconductor device according to an exemplary embodiment. The method begins at operation 200, and at operation 202 a semiconductor structure is formed on a semiconductor-on-insulator (SOI) substrate. The semiconductor structure includes, for example, a semiconductor fin formed on an insulator layer of the SOI substrate, and a gate stack formed on the semiconductor fin. According to at least one exemplary embodiment, the semiconductor fin may be formed from, for example, Si. At operation 204, the semiconductor fin is etched to expose the insulator layer defining first and second source/drain regions, and sidewalls of the semiconductor fin. At operation 206, a SiGe layer is grown on the sidewalls of the Si fin. According to at least one embodiment, SiGe gas may be introduced to the semiconductor device. Silicon germanium ions included with the gas attach to the exposed sidewalls of Si fin to form the SiGe layer. At operation 208, the semiconductor device is annealed such that the SiGe ions of the SiGe layer diffuse into the fin. As a result, a fin having a superlattice structure comprising SiGe/Si is formed beneath the gate stack. At operation 210, source/drain structures are epitaxially grown on the exposed insulator layer of the source/drain region. At operation 212, a second annealing process is applied to the semiconductor device. The second annealing process causes the ions of the epitaxially source/drain structures to diffuse into the SiGe/Si fin to form source/drain extension portions. The source/drain extension portions define a SiGe gate channel beneath the gate stack. At operation 214, spacers of the gate stack are etched to increase the gate stack length stack such that the extension portions overlap the spacers, and the method ends at operation 216.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the operations described therein without departing from the spirit of the invention. For instance, the operations may be performed in a differing order, or operations may be added, deleted or modified. All of these variations are considered a part of the claimed invention.

While a preferred embodiment has been described, it will be understood that those skilled in the art, both now and in the future, may make various modifications which fall within the scope of the claims which follow. These claims should be construed to maintain the proper protection for the invention first described.

What is claimed is:

1. A method of fabricating a semiconductor device, the method comprising:
   forming a semiconductor fin on an insulator layer of a semiconductor-on-insulator (SOI) substrate, forming a gate stack on the semiconductor fin, and forming spacers on sidewalls of the gate stack, wherein, the semiconductor fin comprises silicon (Si) to define a Si fin;
   etching the SOI substrate after forming the gate stack to expose an insulator layer defining at least one source/drain region and to expose silicon sidewalls of the semiconductor fin;
   after forming the gate stack, growing a silicon germanium (SiGe) layer from only the etched silicon sidewalls of the Si fin such that the SiGe layer extends above the insulator layer exposed following the etching and below the spacers;
   annealing the semiconductor device to diffuse SiGe ions of the SiGe layer into the fin so as to convert the entire Si fin disposed beneath the gate stack into a superlattice SiGe/Si fin such that the SiGe/Si fin has a superlattice structure formed beneath the gate stack;
   after forming the superlattice structure, epitaxially forming source/drain structures directly on the exposed insulator layer of the source/drain region; and
   performing a second annealing process after forming the gate stack, the second annealing process diffusing the ions of the epitaxially source/drain structures into the silicon germanium fin to form source/drain extension portions that extend laterally underneath a bottom surface of the spacers and to define a silicon germanium gate channel between the source/drain extension portions and beneath the gate stack.

2. The method of claim 1, where in the spacers are formed on the sidewalls and the upper surface of the gate stack.

3. The method of claim 2, further comprising offsetting the spacers with respect to the source/drain extension portions via the second annealing process.

4. The method of claim 3, further comprising removing a dummy gate of the gate stack to form a trench that exposes spacer sidewalls.

5. The method of claim 4, further comprising etching the spacer sidewalls exposed by the trench to increase the length of the trench.

6. The method of claim 5, further comprising increasing the length of the trench such that the source/drain extension portions overlap the spacer sidewalls and extend beneath the gate stack.

7. The method of claim 6, wherein the semiconductor fin is formed from silicon (Si) such that the diffused SiGe ions form a fin having a SiGe/Si superlattice structure.

8. The method of claim 7, further comprising forming at least one gate insulating layer in the trench and forming a metal gate in the trench such that the gate insulation layer is interposed between the metal gate and the silicon germanium gate channel.

9. The method of claim 8, wherein forming the at least one gate insulating layer includes forming a high dielectric material atop the silicon germanium gate channel and forming a metal contact layer on the high dielectric material.

10. The method of claim 9, wherein the metal gate is formed from tungsten, the high dielectric material is formed from hafnium oxide, and the metal contact layer is formed from one of titanium nitride or titanium carbide.

11. The method of claim 1, wherein an upper surface of the source/drain extension portions is below an upper surface of the spacers.

* * * * *